United States Patent
Lee et al.

(10) Patent No.: US 8,530,263 B2
(45) Date of Patent: Sep. 10, 2013

(54) SUPERSTRATE SOLAR CELL

(75) Inventors: Wen-Chin Lee, Hsinchu (TW); Wen-Tsai Yen, Caotun Township (TW); Liang-Sheng Yu, Kaohsiung (TW); Yung Sheng Chiu, Fusing Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 215 days.

(21) Appl. No.: 13/207,058

(22) Filed: Aug. 10, 2011

(65) Prior Publication Data

US 2013/0037093 A1 Feb. 14, 2013

(51) Int. Cl.
*H01L 21/00* (2006.01)
*H01L 31/00* (2006.01)

(52) U.S. Cl.
USPC .......... 438/72; 438/68; 438/73; 438/85; 438/462; 136/252

(58) Field of Classification Search
USPC .......... 438/57, 68, 72, 73, 84, 85, 86, 95, 438/458, 460, 462, 463; 136/252, 260–265
See application file for complete search history.

(56) References Cited

U.S. PATENT DOCUMENTS

| | | | | |
|---|---|---|---|---|
| 5,593,901 A * | 1/1997 | Oswald et al. | | 438/80 |
| 8,227,287 B2 * | 7/2012 | Ghandour | | 438/68 |
| 8,304,646 B2 * | 11/2012 | Luch | | 136/256 |
| 8,329,496 B2 * | 12/2012 | Ghandour | | 438/68 |

OTHER PUBLICATIONS

Singh, Udai P., et al., "Progress in Polycrystalline Thin-Film Cu(In,Ga)Se2 Solar Cells", International Journal of Photoenergy vol. 201, Article ID 468147, 2010, pp. 1-19.
Haug, F.-J., et al., "Comparison of Structural and Electrical Properties Cu(In, Ga)Se2 for Substrate and Superstrate Solar Cells", Thin Solid Films 403-404, 2002, pp. 293-296.
Holley, William H., et al., "Investigation into the Causes of Browning in EVA Encapsulated Flat Plate PV Modules", IEEE WCPEC, 1994, pp. 893-896.
Nakada, Toldo, et al., "Superstrate-Type CuInSe2 Solar Cells With Chemically Deposited CdS Window Layers", IEEE WCPEC, 1994, pp. 95-98.

* cited by examiner

*Primary Examiner* — Kevin M Picardat
(74) *Attorney, Agent, or Firm* — Duane Morris LLP

(57) ABSTRACT

A method of fabricating a solar cell includes forming a front contact layer over a substrate, and the front contact layer is optically transparent at specified wavelengths and electrically conductive. A first scribed area is scribed through the front contact layer to expose a portion of the substrate. A buffer layer doped with an n-type dopant is formed over the front contact layer and the first scribed area. An absorber layer doped with a p-type dopant is formed over the buffer layer. A back contact layer that is electrically conductive is formed over the absorber layer.

20 Claims, 5 Drawing Sheets

SUPERSTRATE SOLAR CELL

TECHNICAL FIELD

The present disclosure relates generally to a solar cell and, more particularly, to a superstrate solar cell.

BACKGROUND

A solar cell includes a p-type doped absorber layer and an n-type doped buffer layer. For some superstrate solar cells, the absorber layer is deposited at a high temperature after the buffer layer (e.g., CdS) is formed. However, there is a cross-diffusion of elements between the buffer layer and the absorber layer during the deposition of the absorber layer at a high temperature.

BRIEF DESCRIPTION OF THE DRAWINGS

Reference is now made to the following descriptions taken in conjunction with the accompanying drawings, in which.

DETAILED DESCRIPTION

Figure 1:
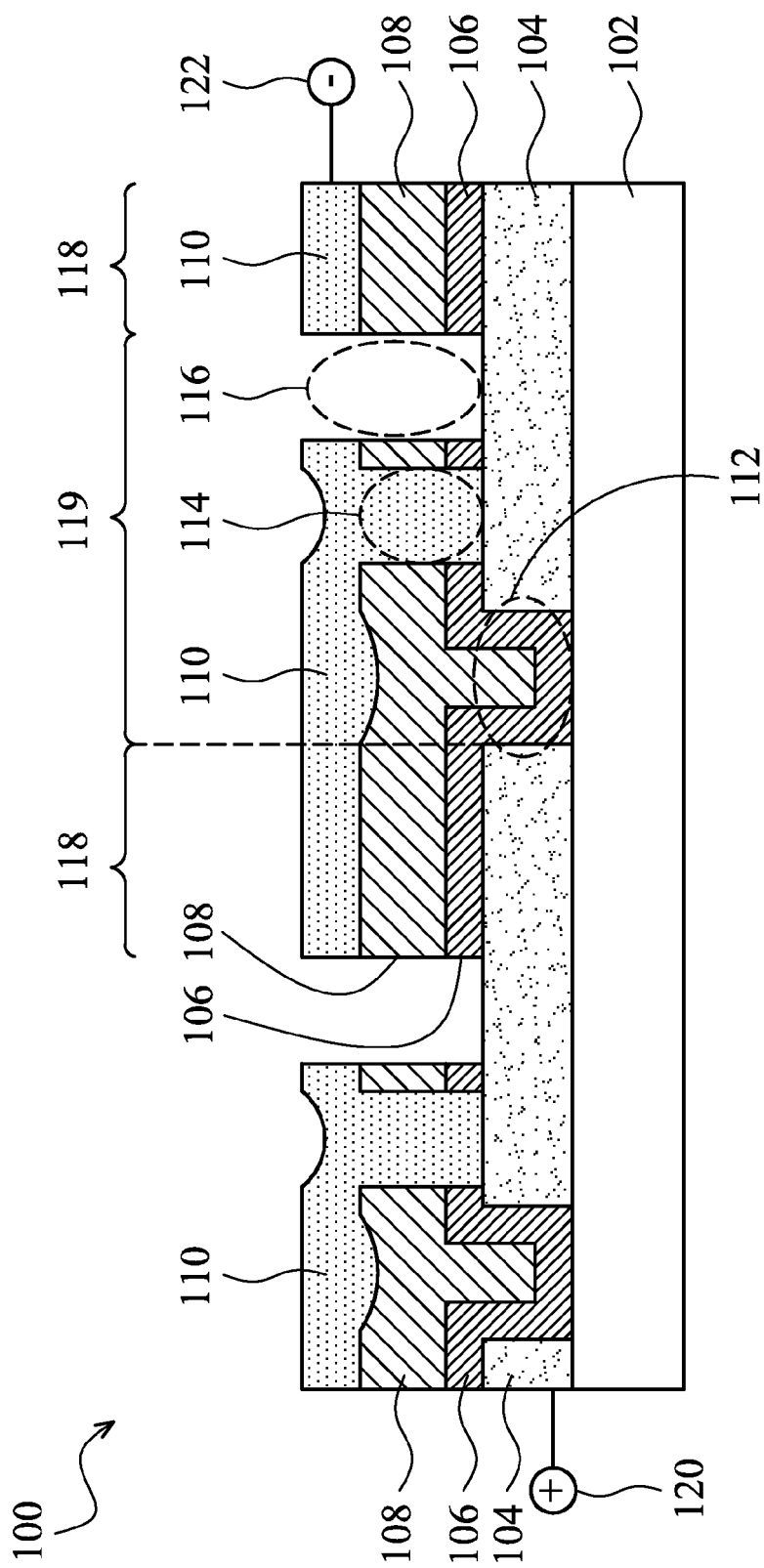
FIG. 1 is a schematic diagram of an exemplary superstrate solar cell module according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic diagram of an exemplary superstrate solar cell module according to some embodiments. The superstrate solar cell module 100 includes a substrate 102 (e.g., glass), a front contact layer 104 (e.g., transparent conductive oxide, TCO), a buffer layer 106 (e.g., CdS), an absorber layer 108 (e.g., copper indium gallium selenide, CIGS), and a back contact layer 110 (e.g., Mo). A positive node 120 is coupled to the front contact layer 104 and a negative node 122 is coupled to the back contact layer 110 for electrical connections.

The substrate 102 allows light at specified wavelengths to pass through to generate electricity by the solar cell 100. In some embodiments, the substrate 102 comprises glass (e.g., soda-lime glass), flexible polyimide, or any other suitable material and has a thickness of about 0.1-3 mm in some embodiments.

The first scribed area 112 vertically divides the front contact layer 104. The first scribed area 112 is made by a scribing process (e.g., mechanical scribing or laser scribing) to define an active area 118 and an interconnection area 119. The first scribed area 112 is filled by the buffer layer 106 and the absorber layer 108. The second scribed area 114 vertically divides the buffer layer 106 and the absorber layer 108. The second scribed area 114 is made by a scribing process (e.g., mechanical scribing or laser scribing) to define an electrical path for the interconnection between the front contact layer 104 and the back contact layer 110. The second scribed area 114 is filled by the back contact layer 110.

The third scribed area 116 vertically divides the buffer layer 106, the absorber layer 108, and the back contact layer 110. The third scribed area 116 is made by a scribing process (e.g., mechanical scribing or laser scribing) to provide isolation between adjacent cells. In some embodiments, the first and second scribed areas 112 and 114 have a width of about 45-85 µm, and the third scribed area 116 has a width of about 48-68 µm. The scribing process facilitates the fabrication flow of superstrate solar cells.

The front contact layer 104 is a thin film which is optically transparent at specified (target) wavelengths and electrically conductive. In some embodiments, the front contact layer 104 comprises TCOs such as $SnO_2$, $In_2O_3$:Sn (ITO), $In_2O_2$:Ga, $In_2O_3$:F, $Cd_2SnO_4$ (CTO), $Zn_2SnO_4$, fluorine doped tin oxide (FTO), zinc oxide (ZnO) doped with group III elements such as aluminium-doped zinc oxide (ZnO:Al, AZO), or indium-doped cadmium oxide. Narrow lined metal grids (Ni—Al) can be deposited on top of the TCO in order to reduce the series resistance in some embodiments.

The TCOs has a thickness of about 0.25-1.5 µm in some embodiments. The TCOs are doped with n-type dopants, but some TCOs may be doped with p-type dopants. The front contact layer 104 can also comprise organic films using carbon nanotube networks and/or graphene, which can be fabricated to be highly transparent to the infrared light, along with networks of polymers such as poly(3,4-ethylenedioxythiophene) or its derivatives.

The buffer layer 106 can comprise CdS, $In_xSe_y$, $In(OH)_xS_y$, ZnO, ZnSe, ZnS, ZnS(O,OH), $ZnIn_2Se_4$, ZnMgO, any combination thereof, or any other suitable material, and doped with n-type dopants. The buffer layer 106 has a thickness of about 0.01-0.1 µm in some embodiments.

The buffer layer 106 (e.g., CdS layer) helps the band alignment of the solar cell device, builds a depletion layer to reduce tunneling, and establishes a higher contact potential that allows higher open circuit voltage (Voc) value. In some embodiments, the buffer layer 106 comprises multiple layers, e.g., a CdS bilayer consisting of a thinner high-resistive layer, prepared either by evaporation or CBD, and a thicker low-resistivity layer, doped with 2% In or Ga.

The absorber layer 108 is a p-type layer, and can comprise combinations of Group-(I, III, VI) elements in the periodic table such as (Cu, Ag, Au|Al, Ga, In|S, Se, Te) including CIGS, or any other suitable material. I-III-$VI_2$ semiconductors, such as copper indium selenide (CIS) or CIGS are referred to as chalcopyrites because of their crystal structure. These materials are prepared in a wide range of compositions.

For the preparation of solar cells, slightly Cu-deficient compositions of p-type conductivity can be used as the absorber layer 108.

In some embodiments, the absorber layer 108 comprises $CuInSe_2$, $CuGaTe_2$, $Cu_2Ga_4Te_7$, $CuInTe_2$, $CuInGaSe_2$, $CuInGaSeS_2$, $CuInAlSe_2$, $CuInAlSeS_2$, $CuGaSe_2$, $CuAlSnSe_4$, $ZnIn_2Te_4$, $CdGeP_2$, $ZnSnP_2$, any combination thereof, or any other suitable material. The absorber layer 108 has a thickness of about 0.1-4 μm in some embodiments. The absorber layer 108 may comprise multiple layers with different level of doping with p-type dopants dopant in some embodiments.

The back contact layer 110 that is electrically conductive can comprise Mo, Pt, Au, Cu, Cr, Al, Ca, Ag, any combination thereof, or any other suitable material, and has a thickness of about 0.5-1.5 μm in some embodiments. For example, Mo (molybdenum) as the back contact layer 110 exhibits relatively good stability during processing, resistance to alloying with Cu and In, and low contact resistance to absorber layer 108. The typical value of resistivity of Mo is about $5 \times 10^{-5}$ Ωcm or less.

The superstrate solar cell 100 can be used in a tandem structure or a multi-junction solar cell structure, in which the superstrate solar cell functions as a top cell for the shorter wavelength part of a light source. The glass substrate of the superstrate solar cell not only acts as a support but also as a part of the encapsulation, thus lowering module cost compared to a substrate solar cell.

Compared to the superstrate solar cell 100, the encapsulation of the substrate solar cell requires an additional glass to protect the structure against environmental conditions and physical impacts, and a transparent/UV-resistant encapsulant or pottant, such as ethylene vinyl acetate (EVA) is used. The conventional EVA pottants are subjected to yellow-to-brown discoloration upon photochemical or photothermal degradation with regard to long-term weathering stability. The superstrate solar cell 100 in FIG. 1 does not need the additional encapsulation, incurring less EVA encapsulation package reliability problems, thus enables a lower cost fabrication.

Figure 2A:
FIGS. 2A-2H are schematic diagrams of the exemplary superstrate solar cell of FIG. 1 at various fabrication steps according to some embodiments.
Figure 2B:
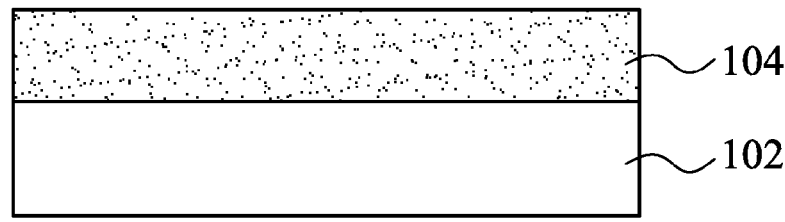

FIGS. 2A-2H are schematic diagrams of the superstrate solar cell in FIG. 1 in various fabrication steps according to some embodiments. In FIG. 2A, the substrate 102 is shown before adding other layers. In FIG. 2B, the front contact layer 104 is formed over the substrate 102. In one example, an Al-doped ZnO is RF-sputtered to form the front contact layer 104. In another example, a combination of intrinsic zinc oxide (i-ZnO) and AZO are formed for the front contact layer 104 by RF magnetron sputtering and electrodeposition.

Figure 2C:
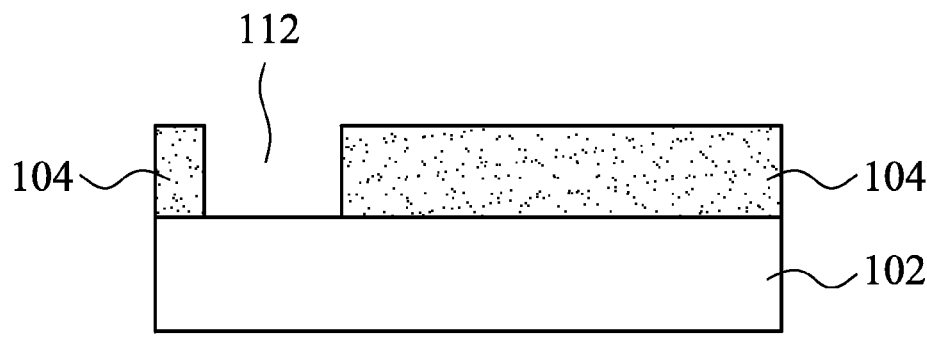

In FIG. 2C, the first scribed area 112 (an opening at this step) is scribed through the front contact layer 104, e.g., by using a laser scribing or mechanical scribing process. The first scribed area 112 exposes a portion of the substrate 102 and vertically divides the front contact layer 104. The first scribed area 112 defines the active area 118 and the interconnection area 119 in FIG. 1. (The first scribed area 112 is later filled by the buffer layer 106 and the absorber layer 108 in FIG. 2D and FIG. 2E.)

Figure 2D:
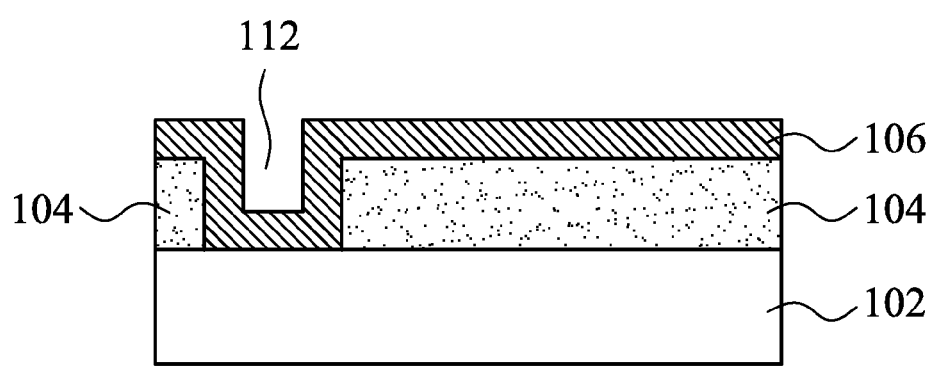

In FIG. 2D, the buffer layer 106 is formed over the front contact layer 104 and the first scribed area 112 of the substrate 102. The buffer layer 106 can be deposited by Chemical Bath Deposition (CBD), Molecular Beam Epitaxy (MBE), Metalorganic Chemical Vapor Deposition (MOCVD), Atomic Layer Deposition (ALD), Atomic Layer CVD (ALCVD), Physical Vapor Deposition (PVD), evaporation, sputtering, Ion Layer Gas Reaction (ILGAR), Ultrasonic Spray (US), or any other suitable process.

Figure 2E:
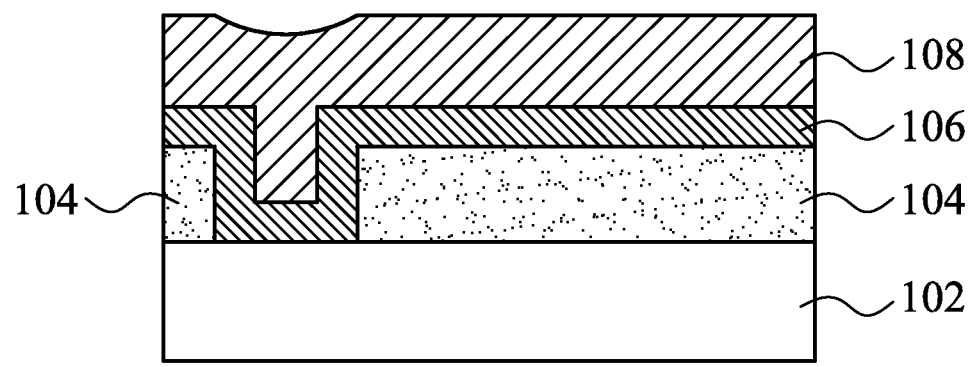

In FIG. 2E, the absorber layer 108 is formed over the buffer layer 106 and the first scribed area 112. Various thin-film deposition methods can be used to deposit the absorber layer 108, such as $Cu(In,Ga)Se_2$. In one fabrication method, a two-step process is used that separates the delivery of the metals from the reaction to form device quality films for the absorber layer 108. The first step is the depositions of precursor materials, e.g., by sputtering using binary (Cu—Ga, Cu—Se, Ga—Se, In—Se), ternary (Cu—In—Ga, Cu—In—Al, Cu—In—Se) or quaternary (Cu—In—Ga—Se, Cu—Al—In—Se) targets.

The second step is selenization, e.g., by evaporating or sputtering Se, and thermal annealing in a controlled reactive or inert atmosphere (e.g., Ar or $N_2$) for optimum compound CIGS formation via the chalcogenization reaction (i.e., selenization of stacked metal or precursor alloy layers). The selenization can be included in the first step and the second step can be thermal annealing in some embodiments. In one exemplary process for the second step, a rapid thermal processing (RTP) is applied, which provides the conversion reaction of the precursor layers to the chalcopyrite-semiconductor. In some embodiments the RTP process has ramp rates greater than 10° C./sec in Ar or $N_2$ and then maintains at target temperatures of about 400-600° C. for about 5-30 min or less.

The RTP process reduces the inter-diffusion problem between the absorber layer 108 and the buffer layer 106 (e.g., CdS) interface due to shorter heating and cooling times. The shorter heating and cooling times also facilitates a high throughput/yield fabrication process due to faster processing time. In another exemplary process for the second step, the precursor films are reacted in $H_2Se$ or Se vapor at about 400-500° C. for about 30-60 min to form the absorber layer 108.

The precursor metals and/or alloys can be deposited by a variety of methods which involve vacuum or no vacuum. For example, sputtering, thermal evaporation, plasma-enhanced CVD, Atmospheric Pressure Metal organic Chemical Vapor Deposition (AP-MOCVD), or flash evaporation. In one vacuum-based approach, Cu/In layers are sputtered and reacted in hydrogen sulfide to form $CuInS_2$.

In another exemplary method of forming the absorber layer 108 is vacuum co-evaporation in which all the constituents, Cu, In, Ga, and/or Se, can be simultaneously delivered to a substrate heated at 400-600° C. and the Cu(In,Ga)Se2 film is formed in a single growth process.

Figure 2F:
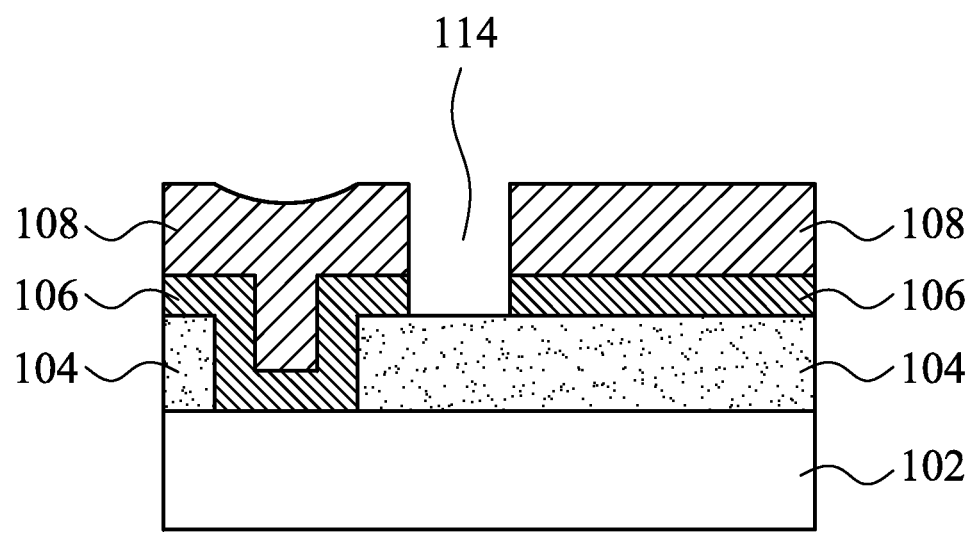

In FIG. 2F, the second scribed area 114 (an opening at this step) is scribed through the absorber layer 108 and the buffer layer 106, e.g., by using a laser scribing or mechanical scribing process. The second scribed area 114 exposes a portion of the front contact layer 104 and vertically divides the buffer layer 106 and the absorber layer 108. The second scribed area 114 defines an electrical path for the interconnection between the front contact layer 104 and the back contact layer 110 in FIG. 2G. The second scribed area 114 is later filled by the back contact layer 110 in FIG. 2G.

Figure 2G:
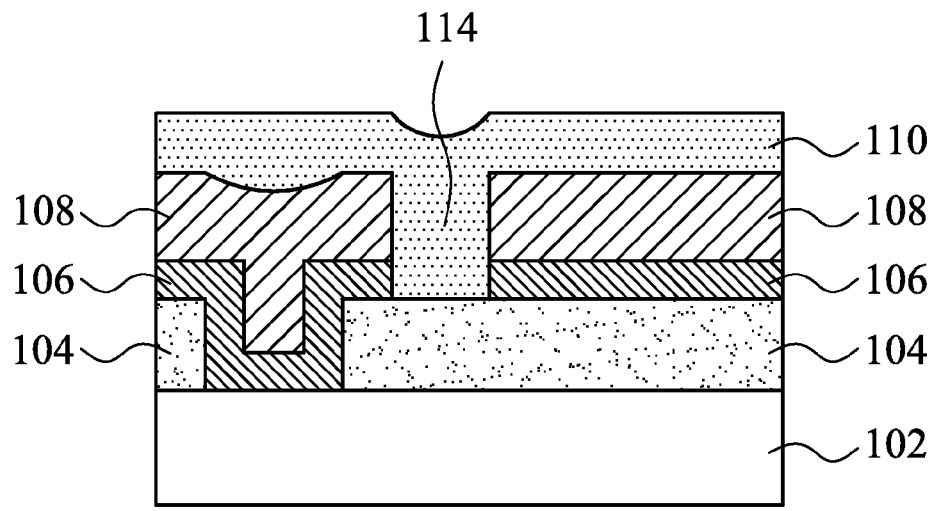

In FIG. 2G, the back contact layer 110 is formed over the absorber layer 108 and the second scribed area 114 of the front contact layer 104. The back contact layer 110 can be deposited, e.g., by e-beam evaporation, sputtering, or any other suitable method. In other embodiments, the back contact layer 110 can comprise multiple layers, e.g., Na-doped Mo/Mo bilayer.

Figure 2H:
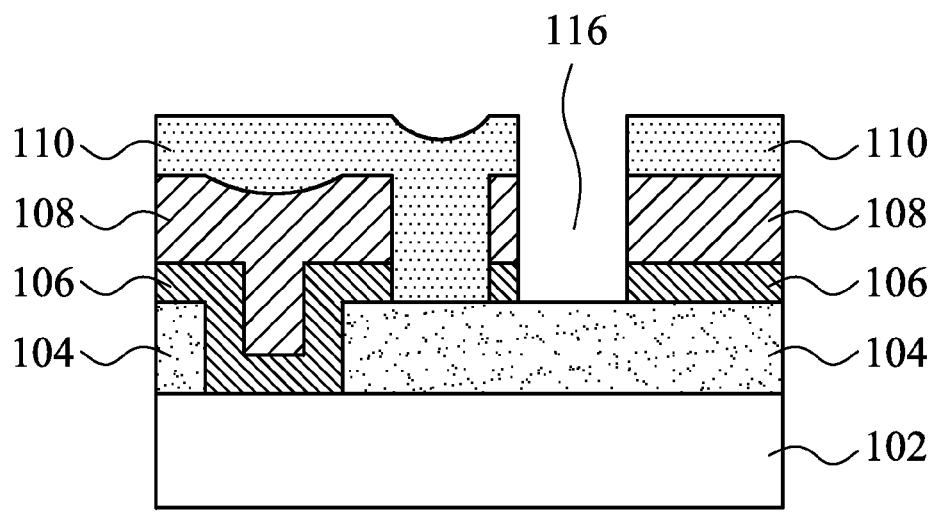

In FIG. 2H, the third scribed area 116 (an opening) is scribed through the back contact layer 110, the absorber layer 108, and the buffer layer 106, e.g., by using a laser scribing or mechanical scribing process. The third scribed area 116 exposes a portion of the front contact layer 104 and vertically divides the buffer layer 106, the absorber layer 108, and the back contact layer 110. The third scribed area 116 provides isolation between adjacent cells.

Figure 3:
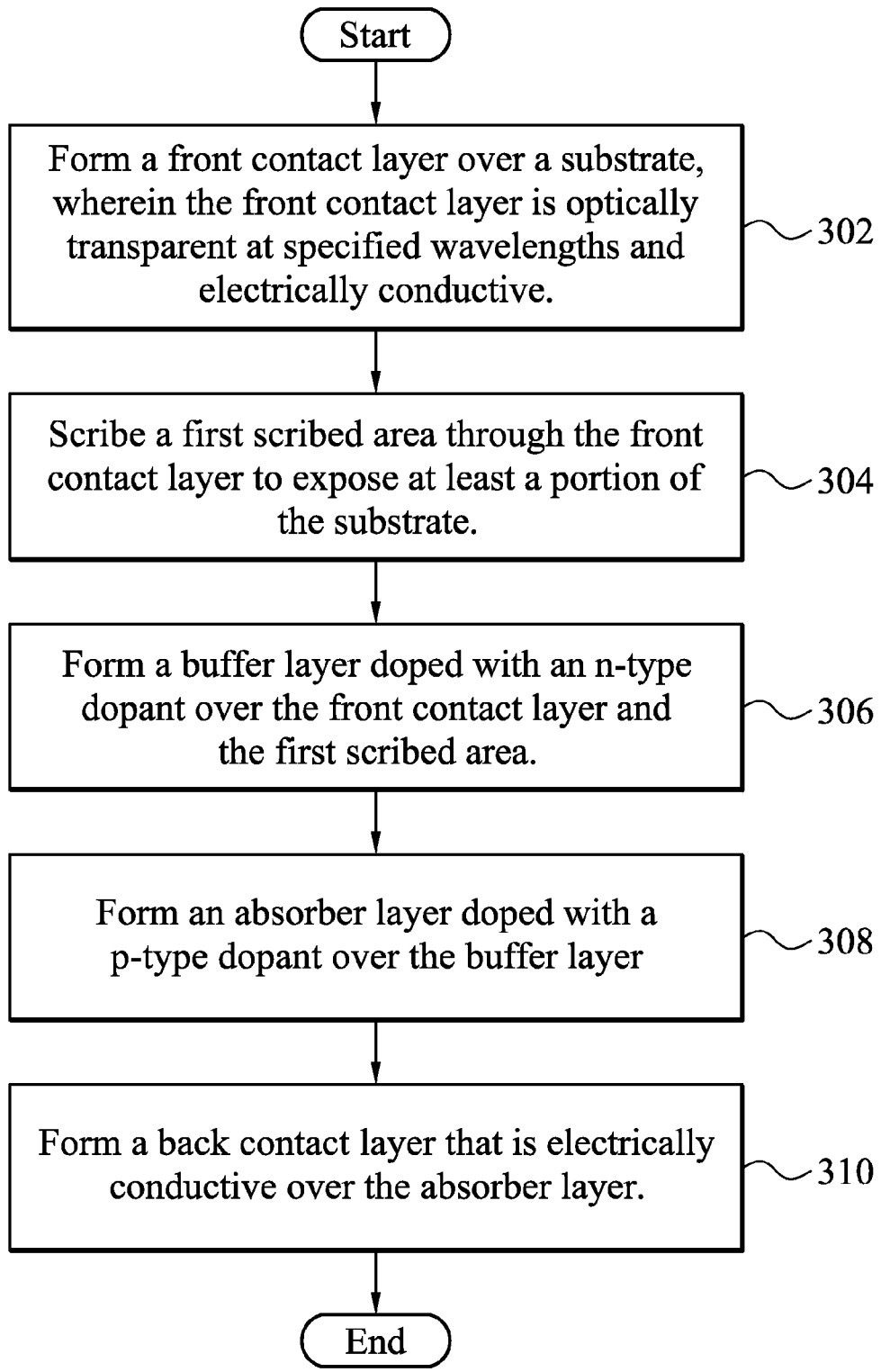
FIG. 3 is a flowchart of a method of fabricating the exemplary superstrate solar cell in FIG. 1 according to some embodiments.

FIG. 3 is a flowchart of a method of fabricating the exemplary superstrate solar cell in FIG. 1 according to some embodiments. Details such as exemplary processes and materials are as described above, and are not repeated again.

At step 302, a front contact layer is formed over a substrate, wherein the front contact layer is optically transparent at specified wavelengths and electrically conductive. At step 304, a first scribed area through the front contact layer is scribed to expose at least a portion of the substrate. At step 306, a buffer layer doped with an n-type dopant is formed over the front contact layer and the first scribed area. At step 308, an absorber layer doped with a p-type dopant is formed over the buffer layer. At step 310, a back contact layer that is electrically conductive is formed over the absorber layer.

According to some embodiments, a method of fabricating a solar cell includes forming a front contact layer over a substrate, wherein the front contact layer is optically transparent at specified wavelengths and electrically conductive. A first scribed area is scribed through the front contact layer to expose at least a portion of the substrate. A buffer layer doped with an n-type dopant is formed over the front contact layer and the first scribed area. An absorber layer doped with a p-type dopant is formed over the buffer layer. A back contact layer that is electrically conductive is formed over the absorber layer.

According to some embodiments, a solar cell includes a substrate and a front contact layer disposed over the substrate. A buffer layer doped with an n-type dopant is disposed over the front contact layer. An absorber layer doped with a p-type dopant is disposed over the buffer layer. A back contact layer is electrically conductive and disposed over the absorber layer. A first scribed area vertically divides the front contact layer. The first scribed area is filled in by the buffer layer and the absorber layer. The front contact layer is optically transparent at specified wavelengths and electrically conductive.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method of fabricating a solar cell, comprising:
    forming a front contact layer over a substrate wherein the front contact layer is optically transparent at specified wavelengths and electrically conductive;
    scribing a first scribed area through the front contact layer to expose a portion of the substrate;
    forming a buffer layer doped with an n-type dopant over the front contact layer and the first scribed area;
    forming an absorber layer doped with a p-type dopant over the buffer layer; and
    forming a back contact layer that is electrically conductive over the absorber layer.

2. The method of claim 1, wherein the first scribed area is formed by mechanical scribing or laser scribing.

3. The method of claim 1, further comprising scribing a second scribed area through the absorber layer and the buffer layer to expose a portion of the front contact layer.

4. The method of claim 3, wherein the second scribed area is filled with the back contact layer.

5. The method of claim 4, further comprising scribing a third scribed area through the back contact layer, the absorber layer, and the buffer layer to expose a portion of the front contact layer.

6. The method of claim 1, wherein forming the absorber layer comprises:
    depositing precursor metal layers; and
    applying a rapid thermal processing.

7. The method of claim 6, further comprising evaporating a chemical element Se.

8. The method of claim 6, wherein the rapid thermal processing is performed at a temperature about 400-600° C. for about 30 minutes or less.

9. The method of claim 6, wherein the precursor metal layers include Cu, In, Ga, Se, or any combination thereof.

10. A solar cell, comprising:
    a substrate;
    a front contact layer disposed over the substrate;
    a buffer layer doped with an n-type dopant disposed over the front contact layer;
    an absorber layer doped with a p-type dopant disposed over the buffer layer;
    a back contact layer that is electrically conductive and disposed over the absorber layer;
    a first scribed area that vertically divides the front contact layer, the first scribed area filled in by the buffer layer and the absorber layer,
    wherein the front contact layer is optically transparent at specified wavelengths and electrically conductive.

11. The solar cell of claim 10, further comprising a second scribed area that vertically divides the buffer layer and the absorber layer.

12. The solar cell of claim 11, wherein the second scribed area is filled by the back contact layer.

13. The solar cell of claim 12, further comprising a third scribed area that vertically divides the buffer layer, the absorber layer, and the back contact layer.

14. The solar cell of claim 10, wherein substrate comprises glass or polyimide.

15. The solar cell of claim 10, wherein the front contact layer comprises transparent conductive oxide (TCO).

16. The solar cell of claim 10, wherein the buffer layer comprises CdS, $In_xSe_y$, $In(OH)_xS_y$, ZnO, ZnSe, ZnS, ZnS(O,OH), $ZnIn_2Se_4$, ZnMgO, or any combination thereof.

17. The solar cell of claim 10, wherein the absorber layer comprises $CuInSe_2$, $CuGaTe_2$, $Cu_2Ga_4Te_7$, $CuInTe_2$, $CuInGaSe_2$, $CuInGaSeS_2$, $CuInAlSe_2$, $CuInAlSeS_2$, $CuGaSe_2$, $CuAlSnSe_4$, $ZnIn_2Te_4$, $CdGeP_2$, $ZnSnP_2$, or any combination thereof.

18. The solar cell of claim 10, wherein the back contact layer comprises Mo, Pt, Au, Cu, Cr, Al, Ca, Ag, or any combination thereof.

19. A method of fabricating a solar cell, comprising:
forming a front contact layer over a substrate wherein the front contact layer is optically transparent at specified wavelengths and electrically conductive;
scribing a first scribed area through the front contact layer to expose a portion of the substrate;
forming a buffer layer doped with an n-type dopant over the front contact layer and the first scribed area;
forming an absorber layer doped with a p-type dopant over the buffer layer;
scribing a second scribed area through the absorber layer and the buffer layer to expose a portion of the front contact layer;
forming a back contact layer that is electrically conductive over the absorber layer and the second scribed area; and
scribing a third scribed area through the back contact layer, the absorber layer, and the buffer layer to expose a portion of the front contact layer.

20. The method of claim 19, wherein forming the absorber layer comprises:
depositing precursor metal layers including Cu, In, Ga, Se, or any combination thereof;
evaporating Se; and
applying a rapid thermal processing.

* * * * *